United States Patent [19]
Ozaki et al.

[11] Patent Number: 5,456,996
[45] Date of Patent: Oct. 10, 1995

[54] RADIATION-SENSITIVE POSITIVE RESIST COMPOSITION

[75] Inventors: Haruyoshi Ozaki, Toyonaka; Fumio Oi, Ashiya; Yasunori Uetani, Minoo; Makoto Hanabata, Hyogo; Takeshi Hioki, Tondabayashi, all of Japan

[73] Assignee: Sumitomo Chemical Company, Limited, Osaka, Japan

[21] Appl. No.: 224,563

[22] Filed: Apr. 7, 1994

Related U.S. Application Data

[62] Division of Ser. No. 948,466, Sep. 22, 1992, which is a continuation of Ser. No. 466,657, Jan. 17, 1990, abandoned, which is a continuation-in-part of Ser. No. 375,999, Jul. 6, 1989, abandoned.

[30] Foreign Application Priority Data

Jul. 7, 1988 [JP] Japan .................. 63-169477
Dec. 27, 1988 [JP] Japan .................. 63-331074

[51] Int. Cl.$^6$ .................................. G03F 7/023
[52] U.S. Cl. .................. 430/191; 430/165; 430/192; 430/193
[58] Field of Search .................. 430/191, 192, 430/193, 165

[56] References Cited

U.S. PATENT DOCUMENTS

| | | | |
|---|---|---|---|
| 3,188,210 | 6/1965 | Fritz et al. | 430/192 |
| 4,390,664 | 6/1983 | Kanayama | 525/117 |
| 4,477,553 | 10/1984 | Yamamoto et al. | 430/192 |
| 4,536,465 | 8/1985 | Uehara et al. | 430/192 |
| 4,650,741 | 3/1987 | Miura et al. | 430/192 |
| 4,695,408 | 9/1987 | Chang | 552/115 |
| 4,812,551 | 3/1989 | Oi et al. | 430/192 |
| 4,883,739 | 11/1989 | Sakaguchi et al. | 430/191 |
| 4,920,028 | 4/1990 | Lazarus et al. | 430/192 |
| 5,019,479 | 5/1991 | Oka et al. | 430/192 |
| 5,215,856 | 6/1993 | Jayaraman | 430/192 |

FOREIGN PATENT DOCUMENTS 211667 2/1987 European Pat. Off. .

OTHER PUBLICATIONS

Patent Abstracts of Japan, vol. 9, No. 323, p. 414, (Dec. 1985), JP 60150047 (1).

Primary Examiner—John S. V. Chu
Attorney, Agent, or Firm—Birch, Stewart, Kolasch & Birch

[57] ABSTRACT

A positive resist composition which comprises, in admixture, a photosensitive 1,2-quinone diazide compound, an alkali-soluble resin to bind ingredients and polyphenol compound to control a dissolution rate in a developer having a molecular weight of not more than 550 and represented by the general formula:

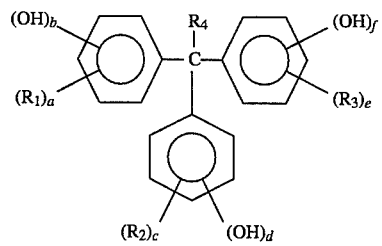

wherein a, b, c, d, e, and f are the same or different and a number of 0–3, provided that d+f is not less than 1, and provided that if b, d and f are 1, then at least one of a, c, and e is not 0; $R_1$, $R_2$ and $R_3$ are the same or different and a $C_1$-$C_{18}$ alkyl group, a $C_1$-$C_{18}$ alkoxy group, a carboxyl group or a halogen atom; $R_4$ is a hydrogen atom, a $C_1$-$C_{18}$ alkyl group or aryl group, wherein an amount of said 1,2-quinone diazide compound is from 5 to 100% by weight and an amount of said polyphenol compound is from 4 to 40% by weight based on the total weight of said alkali-soluble resin, wherein the resist composition is sensitive to radiation and has good balance of sensitivity, resolving power and heat resistance.

7 Claims, No Drawings

RADIATION-SENSITIVE POSITIVE RESIST COMPOSITION

BACKGROUND OF THE INVENTION

1. Field of the Invention

This application is a divisional of application Ser. No. 07/948,466, filed on Sep. 22, 1992, now pending, which is a continuation of Ser. No. 07/466,657 filed on Jan. 17, 1990, now abandoned, which is a CIP of Ser. No. 07/375,999 filed on Jul. 6, 1989, now abandoned, the entire contents of which are hereby incorporated by reference.

The present invention relates to a radiation-sensitive positive resist composition which is sensitive to ultraviolet rays, far ultraviolet rays (excimer laser and so on), electron rays, ion beams and radio active rays such as X-rays.

2. Description of the Related Art

Recently, particularly in the production of integrated circuits, miniaturization has proceeded as the integration level has increased, which has resulted in demands for formation of patterns on the submicron order and more excellent resolving power. According to the conventional processes for the production of integrated circuits, light exposure is accomplished by placing a mask with intimate contact to a substrate such as a silicon wafer. It is said that this process cannot make patterns thinner than 2 μm. Instead of such conventional processes, the reduction projection exposure system attracts attention. According to this new system, a pattern of a master mask (reticle) is projected on the substrate with reduction by a lens system, whereby exposure is accomplished. This system realizes a resolving power of 1 μm.

One of the serious problems in this system is low throughput. Namely, in this system, the total exposure time for exposing a wafer is very long because of divided and repeated light exposure, unlike a batch light exposure system such as the conventional mask contact printing method.

For solving this problem, not only the improvement of the apparatus but also increase in sensitivity of the resist to be used are important. If the exposure time can be shortened by the increase of the sensitivity, the throughput, and in turn the yield, can be improved.

On the other hand, as the distance between the adjacent two lines is decreased with the increase of the integration level, dry etching is predominantly used rather than wet etching. Then, the photoresist should have better heat resistance than ever.

When the positive photoresist now in practical use is viewed from this standpoint, its sensitivity, resolving power and heat resistance are not necessarily satisfactory. Generally, the positive photoresist has lower sensitivity than the negative photoresist, and improvement in the sensitivity of the former is desired.

For increasing the sensitivity, it is easiest to decrease the molecular weight of the novolak resin used in the positive photoresist. The decrease of the novolak resin molecular weight accelerates dissolution of the photoresist in an alkaline developing solution so that the apparent sensitivity of the photoresist is increased.

This method, however, has a very serious disadvantage such as deterioration of the heat resistance of the photoresist. Moreover, it encounters some problems such as large film thickness loss in an unexposed area (reduction of so-called film thickness retention), deterioration of the shape of the pattern, and deterioration of the γ-value because of the small difference of the dissolving rates in the developing solution between the exposed area and the unexposed area.

In view of this, positive resists possessing sensitivity, resolving power and heat resistance at the same time have not been on the market up to now. Trying to improve one of these three characteristics, at least one of the remaining characteristics tends to be impaired.

SUMMARY OF THE INVENTION

One object of the present invention is to provide a positive resist composition which can overcome the above problems associated with the conventional positive resist compositions by the use of a polyphenol compound having a specific structure.

Another object of the present invention is to provide an alkali-soluble resin which comprises such a polyphenol compound having the specific structure.

Accordingly, the present invention provides a positive resist composition which comprises a 1,2-quinone diazide compound and an alkali-soluble resin containing a polyphenol compound (I) of the general formula:

X-α-H           (I)

wherein X is a group of the formula:

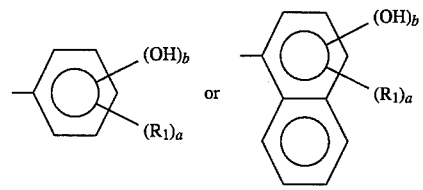

and α is a divalent group which comprises a repeating unit of the formula:

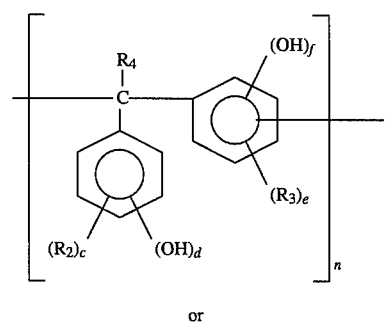

or

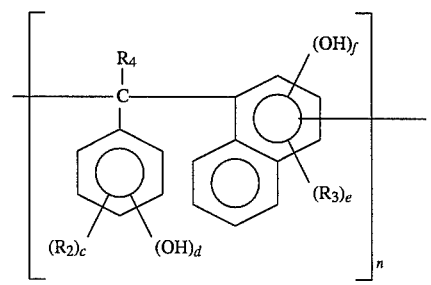

in which n is a number of not less than 1; a, b, c, d, e and f are the same or different and a number of 0–3, provided that d+f is not less than 1; $R_1$, $R_2$ and $R_3$ are the same or different and a $C_1$-$C_{18}$ alkyl group, a $C_1$-$C_{18}$ alkoxy group, a carboxyl group or a halogen atom; $R_4$ is a hydrogen atom, a $C_1$-$C_{18}$ alkyl group or an aryl group.

DETAILED DESCRIPTION OF THE INVENTION

In the compound (I), preferably, each of $R_1$, $R_2$ and $R_3$ is a $C_1$-$C_5$ alkyl group, a methoxy group, an ethoxy group or a carboxyl group. $R_4$ is preferably a hydrogen atom, a $C_1$-$C_5$ alkyl group or an aryl group.

n is preferably not more than 5 because of better sensitivity, better resolving power and better heat resistance of the produced resist in combination with a known alkali-soluble resin.

When n is not more than 5, preferably b, d and f are each not less than 1.

Among the compounds (I), the following compounds are preferably used:

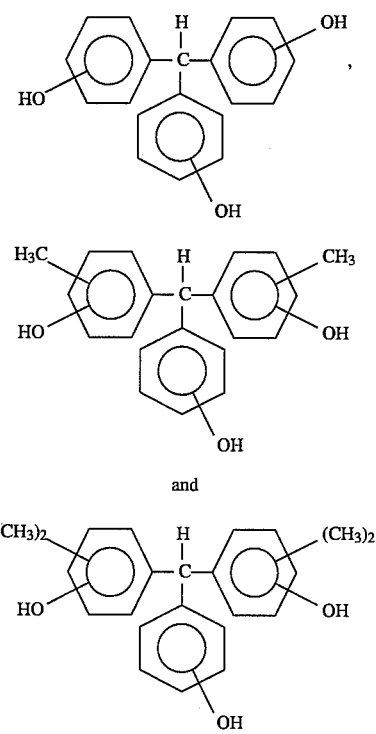

More preferably,

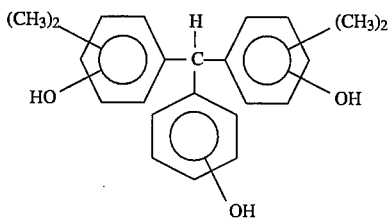

is used.

As long as the polyphenol compound (I) keeps its alkali-solubility, the α group of the polyphenol compound (I) may comprise other repeating units such as the repeating units in which both d and f are 0 in addition to the above repeating unit(s).

The polyphenol compound (I) is obtainable by a condensation reaction of a phenol compound (II) with a carbonyl compound in the presence of an acid catalyst.

Examples of the phenol compound (II) which is condensed with the carbonyl compound include phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, 4-tert.-butylphenol, 2-tert.-butylphenol, 3-tert-.butylphenol, 2-methylresorcinol, 4-methylresorcinol, 5-methylresorcinol, 4-n-hexylresorcinol, 4-dodecylresorcinol, 4-tert.-buthylcathecol, 4-methoxyphenol, 3-methoxyphenol, 2-methoxyphenol, 2-methoxypyrocathecol, 2-methoxyresorcinol, 3-methoxyresorcinol, 2,3-dimethoxyphenol, 2,5-dimethoxyphenol, 3,5-dimethoxyphenol, 2-chloro-5-methylphenol, methyl gallate, ethyl gallate, methyl 3-methoxy-4,5-dihydroxy benzoate, ethyl 4-methoxy-3,5-dihydroxy benzoate, ethyl 3,4-dimethoxy- 5-hydroxy benzoate, methyl 3,5-dimethoxy-4-hydroxy benzoate, ethyl 3,5-dimethoxy-4-hydroxy benzoate, 3-ethylphenol, 2-ethylphenol, 4-ethylphenol, 2,3,5-triethylphenol, 3,5-diethylphenol, 2,5-diethylphenol, 2,3-diethylphenol naphtol and so on.

These phenol compounds may be used alone or in combination.

Examples of the carbonyl compound include benzaldehyde, o-hydroxybenzaldehyde, m-hydroxybenzaldehyde, p-hydroxybenzaldehyde, 2,3-dihydroxybenzaldehyde, 2,4-dihydroxybenzaldehyde, 2,5-dihydroxybenzaldehyde, 3,4-dihydroxybenzaldehyde, 4-carboxybenzaldehyde, acetophenone, o-hydroxyacetophenone, m-hydroxyacetophenone, p-hydroxyacetophenone, octanophenone, 2,4-dihydroxyacetophenone, 2',5'-dihydroxyacetophenone, 2'6'-dihydroxyacetophenone, o-methoxybenzaldehyde, m-methoxybenzaldehyde, p-methoxybenzaidehyde, 2,3-dimethoxybenzaldehyde, 2,4-dimethoxybenzaidehyde, 2,5-dimethoxybenzaldehyde, 3,4-dimethoxybenzaidehyde, 2'4'-dimethoxyacetophenone, 2'5'-dimethoxyacetophenone, 3',4'-dimethoxyacetophenone, 3'5'-dimethoxyacetophenone, 2,2'-dihydroxybenzaldehyde and so on.

These carbonyl compounds may be used alone or in combination.

Examples of the acid catalyst to be used in this condensation reaction include organic or inorganic acids (e.g. oxalic acid, formic acid, p-toluenesulfonic acid, trichloroacetic acid, hydrochloric acid, sulfuric acid, perchloric acid, phosphoric acid, etc.), salts of divalent metals (e.g. zinc acetate, magnesium acetate etc.) and so on. Among them hydrochloric acid is preferred, since selectivity is good and the reaction rate can be controlled easily by changing the concentration of hydrochloric acid.

The amount of the carbonyl compound to be used in the condensation reaction is 0.02 to 3 moles per mole of the phenol compound (II). The amount of the acid catalyst to be used in the condensation reaction is 0.01 to 0.7 mole per mole of the carbonyl compound.

The condensation reaction may be carried out at a temperature of from 30° C. to 250° C. for from 2 to 30 hours.

The reaction may be carried out in bulk or in a suitable solvent.

The suitable solvent includes water, alcohols (e.g. methanol, ethanol, isopropanol, n-butanol, isoamyl alcohol, etc.), ethylcellosolve acetate, ethylcellosolve, methylcellosolve, methyl isobutyl ketone, methyl ethyl ketone, hexane, cyclohexane, heptane, benzene, toluene, xylene, and so on.

Preferably, the amount of the solvent is 10 to 1,000 parts by weight per 100 parts by weight of the phenol compound and the carbonyl compound in total.

When the condensation reaction of 2,5-xylenol with o-hydroxybenzaldehyde is carried out in toluene in the presence of p-toluenesulfonic acid as the catalyst, the amount of toluene is 50 to 500 parts by weight per 100 parts by weight of 2,5-xylenol, and the amount of 2,5-xylenol is 2.0 to 5.0 moles, preferably 3.0 to 4.0 moles per mole of o-hydroxybenzaldehyde. When the condensation reaction of 2,5-xylenol with o-hydroxybenzaldehyde is carried out in methanol in the presence of p-toluenesulfonic acid as the catalyst, The amount of methanol is 50 to 1,000 parts by weight of 2,5-xylenol, and the amount of 2,5-xylenol is preferably 2.0 to 4.0 moles per mole of o-hydroxybenzaldehyde. The amount of p-toluenesulfonic acid is 0.01 to 0.1 mole, preferably 0.02 to 0.03 mole per mole of o-hydroxybenzaldehyde. This reaction may be carried out at a temperature of from 50° C. to the refluxing temperature for 5 to 30 hours.

After removal of metal ions, the condensation product can be purified by a suitable method such as recrystallization and reprecipitation.

A method of removal of the metal ions is as follows:

The product is dissolved in an organic solvent which can be separated from a mixture with water and washed with ion-exchanged water. Examples of such organic solvent include methyl isobutyl ketone, ethylcellosolve acetate, ethyl acetate and so on.

Another method of removal of the metal ions is as follows:

The product is dissolved in an organic solvent which is not separated from a mixture with water, and charged into ion-exchanged water to precipitate the product. Examples of such organic solvent include methanol, ethanol, acetone and so on. This method is preferable because the removal of metal ion and purification of the condensation product are done at the same time.

The amount of the condensation product of the formula:

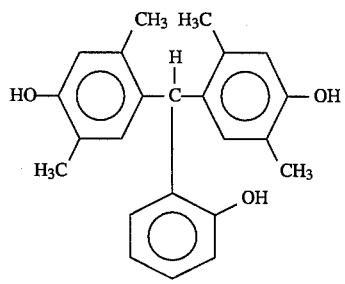

(1)

is 4 to 70 parts, preferably 10 to 40 parts by weight based on 100 parts by weight of the condensation product (1) and the alkali-soluble resin.

The positive resist composition of the present invention may contain at least one alkali-soluble resin other than the polyphenol compound (I). Especially when the polyphenol compound wherein n is not more than 5 in the general formula (I), the amount of the polyphenol compound (I) is 4 to 40 parts by weight based on 100 parts by weight of a total of the alkali-soluble resin, namely the polyphenol compound (i) and the other alkali-soluble resin.

When the amount of the polyphenol compound (I) is less than 4 parts by weight, it is difficult to develop the photoresist because the decrease in solubility in the developing solution, which mainly consists of an alkali solution. When the amount of the polyphenol compound (I) exceeds 40 parts by weight, it is difficult to make the pattern because unitradiated parts are also dissolved easily in the developing solution.

Preferred examples of the other alkali-soluble resins are polyvinylphenol, a novolak resin and so on. The novolak resin is prepared by an addition condensation reaction of a phenol compound with formaldehyde. Specific examples of the phenol compound used as one of the raw materials for the synthesis of the novolak resin include phenol, o-cresol, m-cresol, p-cresol, 2,5-xylenol, 3,5-xylenol, 3,4-xylenol, 2,3,5-trimethylphenol, 4-tert.butylphenol, 2-tert.-butylphenol, 3-tert.-butylphenol, 3-ethylphenol, 2-ethylphenol, 4-ethylphenol, 2-naphtol, 1,3-dihydroxynaphthalene, 1,7-dihydroxynaphthalene, 1,5-dihydroxynaphthalene, etc. These phenols may be used alone or in combination.

The addition condensation reaction of the phenol with formaldehyde can be carried out according to the usual method. This reaction is carried out at a temperature of from 60° to 120° C. for 2 to 30 hours. Organic acids, inorganic acids or divalent metal salts may be used as catalysts. Specific examples of the catalysts are oxalic acid, hydrochloric acid, sulfuric acid, perchloric acid, p-toluenesulfonic acid, trichloroacetic acid, phosphoric acid, formic acid, zinc acetate, magnesium acetate, etc.

Preferably, the novolak resin having a high molecular weight is used. Such the high molecular weight novolak resin can be prepared by removing 30 to 90% by weight of lower molecular weight fractions based on the weight of the novolak resin a weight average molecular weight of which is not less than 2,000 as converted to polystyrene from the reaction product through crystallization, fractionation, etc.

The 1,2-quinone diazide compound to be used as a sensitizer in the positive resist composition of the present invention is not limited. Specific examples of the 1,2-quinone diazide compound are 1,2-benzoquinone diazide-4-sulfonic acid ester, 1,2-naphthoquinone diazide-4-sulfonic acid ester, 1,2-naphthoquinone diazide-5-sulfonic acid ester, etc.

The above esters may be prepared by a per se conventional method. For example, the ester can be prepared by a condensation reaction of a compound having a hydroxyl group with 1,2-naphthoquinone diazide sulfonyl chloride or benzoquinone diazide sulfonyl chloride in the presence of a weak alkali.

Examples of a compound having a hydroxyl group are hydroquinone, resorcinol, phloroglucin, 2,4-dihydroxybenzophenone, 2,3,4-trihydroxybenzophenone, 2,3,4,4'-tetrahydroxybenzophenone, 2,2',4,4'-tetrahydroxybenzophenone, bis(p-hydroxyphenyl)methane, bis(2,4-dihydroxyphenyl)methane, bis(2,3,4-trihydroxyphenyl)methane, 2,2-bis(2,4-dihydroxyphenyl)propane, 2,2-bis(2,3,4-trihydroxyphenyl)propane, hydroxyflavan compounds of the formula:

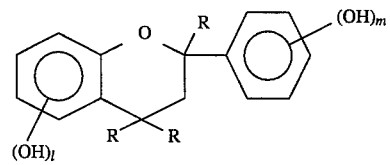

etc.

The positive resist composition of the present invention may contain two or more 1,2-quinonediazide compounds in combination.

The positive resist composition is prepared by mixing and dissolving the 1,2-quinonediazide compound and the alkali-soluble resin including the polyphenol (I) in a solvent.

The amount of the 1,2-quinonediazide compound is 5 to 100, preferably 10 to 50, parts by weight per 100 parts by weight of the alkali-soluble resin.

When the amount of the 1,2-quinonediazide compound is less than 5 parts by weight, it is difficult to make the pattern because of easy dissolution of the composition in the developing solution. When the amount of the 1,2-quinonediazide compound exceeds 100 parts by weight, the irradiation dose has to be increased because short time irradiation cannot decompose all the 1,2-quinonediazide compound added. The large irradiation dose will deteriorate the sensitivity.

Preferably, the used solvent evaporates at a suitable drying rate to give a uniform and smooth coating film. Such solvent includes ethylcellosolve acetate, methylcellosolve acetate, ethylcellosolve, methylcellosolve, propyleneglycol monomethyl ether acetate, butyl acetate, methyl isobutyl ketone, xylene, etc.

To the positive photoresist composition obtained by the foregoing method, small amounts of resins, dyes, etc. may be added if desired.

The resist composition of the present invention has better sensitivity, improved resolving power, and improved heat resistance in comparison with the conventional ones.

PREFERRED EMBODIMENTS OF THE INVENTION

The present invention will be illustrated in more detail with the following Examples, but it is not limited to these Examples. In Examples, "parts" are by weight unless otherwise indicated.

Synthetic Example 1

Into a 500 ml three-necked flask equipped with a stirrer, a condenser, a water separator and a thermometer, phenol (141 g), p-hydroxybenzaldehyde (9.2 g), p-toluenesulfonic acid (0.7 g) and cyclohexane (28 g) were charged and stirred on an oil bath at 80° C. for 4 hours while removing condensed water. After neutralization and washing with water, water and residual phenol were removed under reduced pressure to obtain a novolak resin (14.1 g) on a palette.

The weight average molecular weight of the novolak resin measured by the GPC was 550 as converted to polystyrene.

Synthetic Example 2

Into the same flask as used in Synthetic Example 1, phenol (106 g), m-cresol (41 g), p-hydroxybenzaldehyde (9 g), p-toluenesulfonic acid (0.7 g) and cyclohexane (29 g) were charged and stirred on an oil bath at 80° C. for 4 hours while removing condensed water. After neutralization and washing with water, water, residual phenol and residual m-cresol were removed under reduced pressure to obtain a novolak resin (17.0 g) on a palette.

The weight average molecular weight measured by the GPC was 370 as converted to polystyrene.

Synthetic Example 3

Into the same flask as used in Synthetic Example 1, m-cresol (162.2 g), p-hydroxybenzaldehyde (9.2 g), p-toluenesulfonic acid (0.7 g) and cyclohexane (34 g) were charged and stirred on an oil bath at 80° C. for 4 hours while removing condensed water. After neutralization and washing with water, water and residual m-cresol were removed under reduced pressure to obtain a novolak resin (14.6 g) on a palette.

The weight average molecular weight measured by the GPC was 340 as converted to polystyrene.

Synthetic Example 4

Into the same flask as used in Synthetic Example 1, 2,5-xylenol (134.0 g), salicylaldehyde (33.7 g), p-toluenesulfonic acid (0.83 g) and toluene (268 g) were charged and stirred on an oil bath at 115° C. for 16 hours while removing condensed water. The resulting mixture was filtered at a temperature of 50° to 60° C. to obtain a crude cake.

The crude cake was dissolved in methanol (580 g) at a temperature of 20° to 25° C. and poured in ion-exchanged water (1450 g). Thereafter, the resulting solution was filtered and dried to obtain the compound of the formula (1) (89.3 g). Yield, 98.0 % (based on salicylaldehyde).

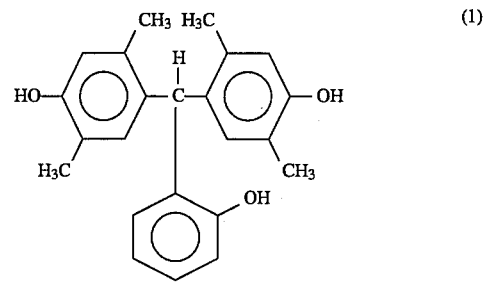

MS: m/e=348 (M⁺)

NMR in acetone-$d_6$ (standard: TMS): δ (ppm) = 2.04 (s, 12H), 5.85 (s, 1H), 6.52 (s, 2H), 6.63 (s, 2H), 6.74 (m, 2H), 6.83 (d, 1H), 7.05 (m, 1H), 7.73 (s, 1H), 8.09 (s, 1H)

Melting point: 274°–275° C.

Synthetic Exammle 5

Into a 5 liter three-necked flask equipped with a stirrer, a condenser, a water separator and a thermometer, 3,4-xylenol (1094 g), salicylaldehyde (488 g) and 20% hydrochloric acid (1955 g) were charged and stirred on an water bath at a temperature of 50° to 55° C. for 43 hours while removing condensed water. The resulting mixture was cooled down to the room temperature and extracted with ethyl acetate (4 l). The hydrochloric acid layer was separated, and the organic layer was washed four times with ion-exchanged water (4 l). After concentration, toluene (5500 g) was added to the solution and stirred at a temperature of 70° to 75° C. for 2 hours. Then the resulting solution was cooled down to the room temperature and filtered to obtain a wet cake. The wet cake was mixed with toluene (2500 g) and ethyl acetate (125 g) and stirred at a temperature of 70° to 75° C. for 2 hours. After cooled down to the room temperature, the mixture was filtered and dried to obtain a cake of a compound represented by the following formula (2) (1211 g). The purity by HPLC was 98.2 %.

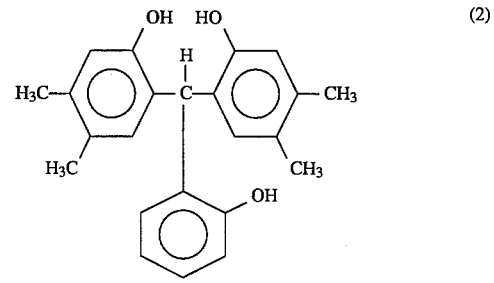

NMR in acetone-$d_6$ (standard: TMS): δ (ppm) = 2.05 (s, 6H), 2.12 (s, 6H), 6.35 (s, 2H), 6.58 (s, 2H), 6.62 (s, 2H), 6.70 (m, 1H), 6.80 (m, 2H) 7.00 (m, 1H), 7.50 (s, 2H), 7.82 (s, 1H)

Melting point: 220° C.

Synthetic Example 6

Into a one liter flask equipped with a stirrer, a condenser, a water separator and a thermometer, 2,6-xylenol (244 g), salicylaldehyde (61.1 g), and conc. hydrochloric acid (300 g) were charged and stirred on a water bath at a temperature of 45° to 50° C. for 6 hours while removing condensed water. The resulting mixture was cooled down to the room temperature and subjected to decantation. The solution was extracted with ethyl acetate (4 l). The hydrochloric acid layer was separated, and the organic layer was washed four times with ion-exchanged water (1 liter). After concentration, toluene (520 g) was added to the solution and stirred at a temperature of 70° to 75° C. for 2 hours. Then, the resulting solution was cooled down to the room temperature and filtered to obtain a wet cake. The wet cake was mixed with toluene (430 g) and stirred at a temperature of 70° to 75° C. for 2 hours. Thereafter, the mixture was cooled down to the room temperature, filtered and dried to obtain a wet cake. The wet cake was washed with toluene (200 g) and dried to obtain a cake of a compound represented by the formula (3) (124 g). The purity by HPLC was 97.6%.

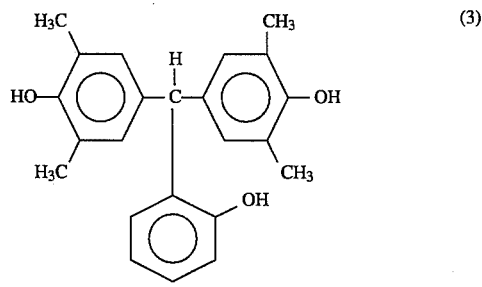

NMR in acetone-$d_6$ (standard: TMS): δ (ppm) =2.14 (s, 12H), 5.56 (s, 1H), 6.67 (s, 4H), 6.80 (m, 1H), 7.03 (s, 2H), 8.06 (s, 1H)

Melting point: 203°–204° C.

Synthetic Example 7

In a 1000 ml three-necked flask, were added m-cresol (149 g), p-cresol (121 g), ethylcellosolve acetate (252 g) and 5% aqueous oxalic acid solution (30.4 g). Then, to the mixture, an aqueous solution of formalin (37.0% (147.8 g) was dropwise added over 40 minutes while heating and stirring on an oil bath kept at 90° C. Thereafter, the reaction mixture was heated while stirring for further 7 hours. After neutralization, washing with water and removing water, a solution of a novolak resin in ethylcellosolve acetate was obtained.

The weight average molecular weight measured by the GPC was 9600 as converted to polystyrene.

Synthetic Example 8

The ethyl cellosolve acetate solution of novolak resin obtained in Synthetic Example 7 (the content of the novolak resin, 41.2 %) (120 g) was added to a 3 liter separable flask, and then ethylcellosolve acetate (868.8 g) and n-heptane (544.6 g) were added. After stirring for 30 minutes at 20° C., the resulting mixture was kept standing and separated. n-Heptane in the recovered lower layer was removed by an evaporator to obtain a novolak resin in ethyl cellosolve acetate.

The weight average molecular weight measured by the GPC was 15500 as converted to polystyrene. Through the separation operation, 75% of the lower molecular weight fractions were removed.

Example 1–7 and Comparative Example 1 and 2

Each of the compounds obtained in Synthetic Examples 1–6 and the novolak resins obtained in Synthetic Example 7–8 was dissolved together with a sensitizer in ethyl cellosolve acetate in amounts in Table 1 to prepare a resist solution. The amount of the solvent was regulated to form a film having a thickness of 1.28 μm when the resist solution was applied under the coating conditions below.

Each composition was filtered through a Teflon (trade mark) filter of 0.2 μm pore size to prepare a resist solution. The solution was then coated on a silicon wafer, which had been rinsed in a usual manner, by means of a spinnerat 4000 rpm. The coated silicon wafer was baked for one minute on a vacuum adsorption-type hot plate kept at 100° C., and exposed to light by varying the exposure time stepwise at each shot by means of a reduction projection exposure apparatus with a 350 W extra-high pressure mercury lamp as a light source. Thereafter, the silicon wafer was developed in a developing solution (SOPD manufactured by Sumitomo Chemical Company, Limited) to obtain a positive pattern. After rinsing and drying, the amount of film thickness loss for each shot was plotted against the exposure time to calculate sensitivity. The film thickness retention was calculated from the remaining film thickness in the unexposed area. Also, the silicon wafer having a resist pattern was placed for 30 minutes in a clean oven set at various temperatures in the air, and the heat resistance was evaluated by observing the resist pattern by means of a scanning microscope.

These results are collectively shown in the following Table.

It is seen from the results in Table that the balance between the sensitivity and heat resistance in the Examples is markedly improved in comparison with that of the Comparative Examples.

TABLE

|  | Example No. | | | | | | | Comp. Ex. No. | |
|---|---|---|---|---|---|---|---|---|---|
|  | 1 | 2 | 3 | 4 | 5 | 6 | 7 | 1 | 2 |
| Amount of polyphenol (parts) | 2.0 | 3.5 | 3.5 | 2.0 | 3.5 | 3.5 | 3.5 | — | — |
| Kind of polyphenol (Synthetic Example No.) | 1 | 2 | 3 | 4 | 4 | 5 | 6 | — | — |
| Amount of cresol novolak resin (parts) | 17 | 13.5 | 13.5 | 15.0 | 13.5 | 13.5 | 13.5 | 17 | 17 |
| Kind of cresol novolak resin (Synthetic Example No.) | 7 | 8 | 8 | 7 | 8 | 8 | 8 | 7 | 8 |
| Sensitizer: | | | | | | | | | |
| Kind*[1] | (1) | (2) | (2) | (1) | (2) | (2) | (2) | (1) | (2) |
| Amount (parts) | 3.5 | 4.5 | 4.5 | 3.5 | 4.5 | 4.5 | 4.5 | 3.5 | 4.5 |

TABLE-continued

|  | Example No. | | | | | | | Comp. Ex. No. | |
| --- | --- | --- | --- | --- | --- | --- | --- | --- | --- |
|  | 1 | 2 | 3 | 4 | 5 | 6 | 7 | 1 | 2 |
| Sensitivity (msec) | 126 | 500 | 525 | 129 | 250 | 255 | 260 | 193 | >800 |
| Film thickness retention (%) | 93.1 | 98.7 | 99.0 | 93.1 | 99.3 | 99.5 | 99.4 | 93.2 | 99.8 |
| Heat resistance*[2] °C. | 140 | 160 | 160 | 140 | 160 | 160 | 160 | 120 | 160 |
| Resolving power*[3] (μm) | 0.9 | 0.8 | 0.8 | 0.8 | 0.7 | 0.7 | 0.7 | 1.0 | 1.0 |

Note:
*[1](1) A condensation product of naphthoquinone-(1,2)-diazide-(2)-5-sulfonyl chloride with 2,3,4-trihydroxybenzophenone.
(2) A condensation product of naphthoquinone-(1,2)-diazide-(2)-5-sulfonyl chloride with 2,3,4,4'-tetrahydroxybenzophenone.
*[2]A temperature in the clean oven at which the resist pattern begins to soften and flow.
*[3]The minimum line width where the lines and spaces are resolved.

What is claimed is:

1. A positive resist composition which comprises, in admixture, a photosensitive 1,2-quinone diazide compound, an alkali-soluble resin to bind ingredients and polyphenol compound to control a dissolution rate in a developer having a molecular weight of not more than 550 and represented by the general formula:

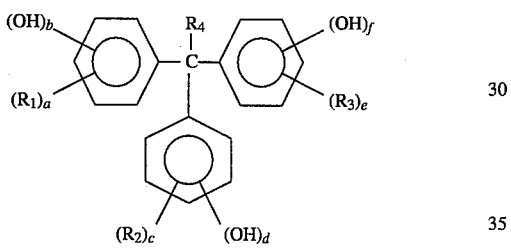

wherein a, b, c, d, e and f are the same or different and a number of 0–3, provided that d+f is not less than 1, and provided that if b, d and f are 1, then at least on of a, c, and e is not 0 ; $R_1$, R2 and $R_3$ are the same or different and a $C_1$-$C_{18}$ alkyl group, a $C_1$-$C_{18}$ alkoxy group, a carboxyl group or a halogen atom; $R_4$ is a hydrogen atom, a $C_1$-$C_{18}$ alkyl group or an aryl group, wherein an amount of said 1,2-quinone diazide compound is from 5 to 100% by weight and an amount of said polyphenol compound is from 4 to 40% by weight based on the total weight of said alkali-soluble resin.

2. The positive resist composition according to claim 1, wherein the polyphenol compound is the compound of the formula:

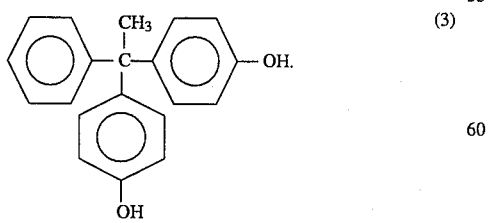
(3)

3. The positive resist composition according to claim 1, wherein said polyphenol compound is selected from the group consisting of

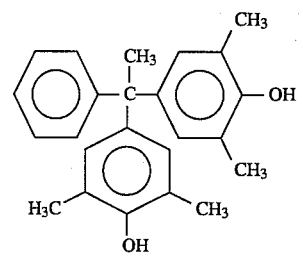

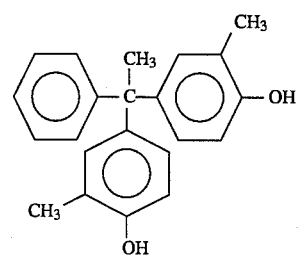

and

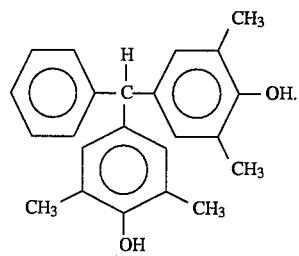

4. The positive resist composition according to claim 1, wherein said polyphenol compound is

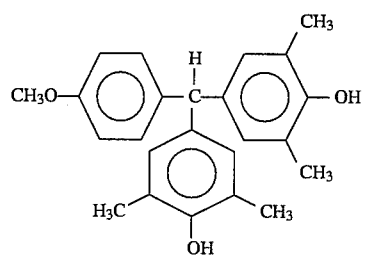

5. The positive resist composition according to claim 1, wherein $R_4$ is hydrogen and b, d and f are each 1.

6. The positive resist composition according to claim 5, wherein the alkali-soluble resin is a novolak resin.

7. The positive resist composition according to claim 6, wherein the novolak resin is a high molecular weight novolak resin prepared by removing 30 to 90% by weight of low molecular weight fractions based on the weight of the novolak resin having a weight average molecular weight measured by GPC which is not less than 2,000 as converted to polystyrene, from the whole resin.

* * * * *